Figure 1:
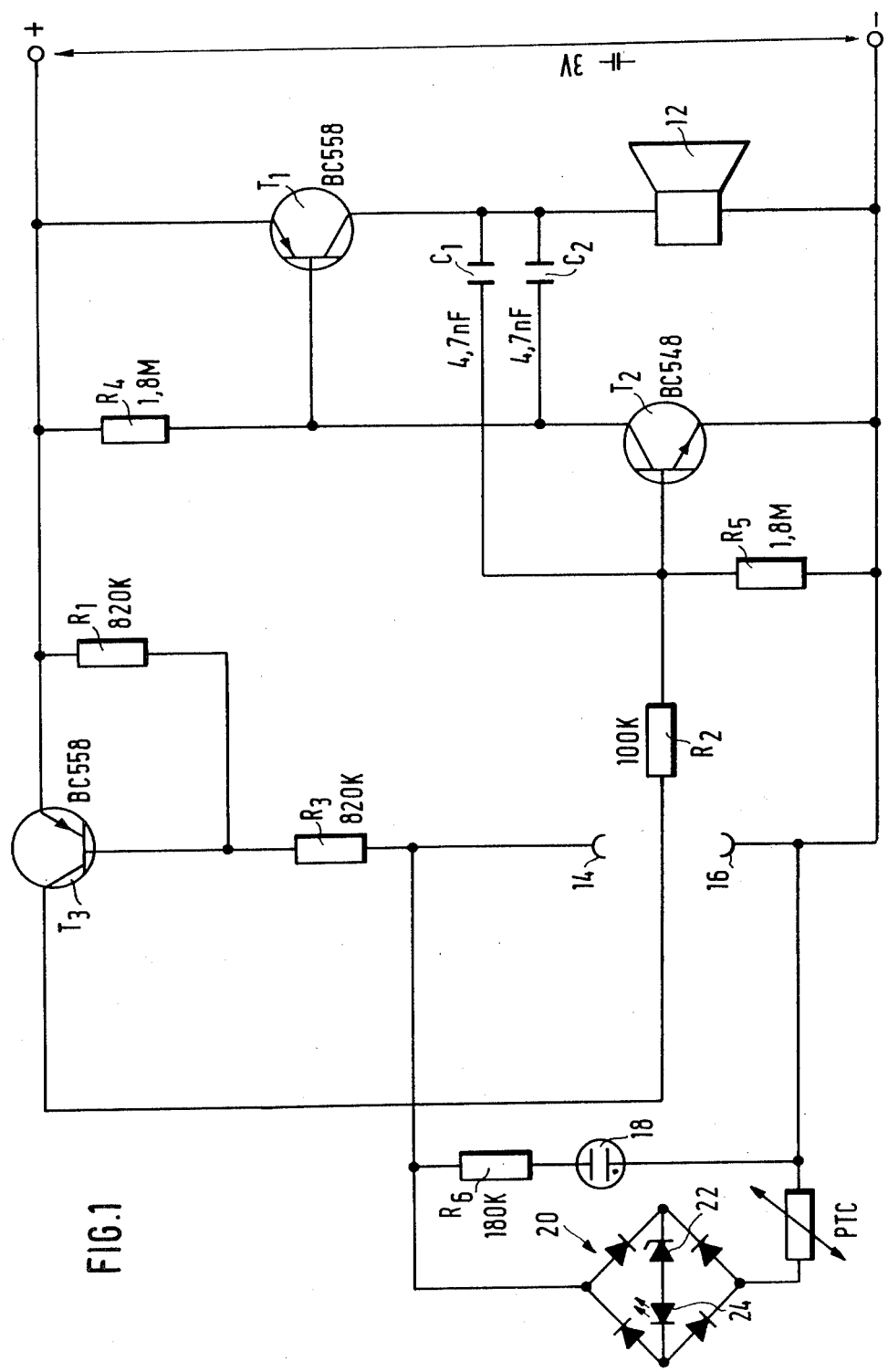

United States Patent [19]

Beha

[11] 4,356,442
[45] Oct. 26, 1982

[54] ELECTRONIC VOLTAGE AND CONTINUITY TESTING UNIT

[76] Inventor: Christian Beha, Föhrentalstrasse 6, 7804 Glottertal, Fed. Rep. of Germany

[21] Appl. No.: 140,476

[22] Filed: Apr. 15, 1980

[30] Foreign Application Priority Data

Apr. 18, 1979 [DE] Fed. Rep. of Germany ....... 2915530

[51] Int. Cl.³ .................... G01R 19/14; G01R 31/02; G01R 15/12
[52] U.S. Cl. ..................................... 324/51; 324/133; 324/149
[58] Field of Search ............... 324/51, 73 R, 133, 149, 324/122, 119

[56] References Cited

U.S. PATENT DOCUMENTS

| | | | |
|---|---|---|---|
| 3,426,274 | 2/1969 | Wise | 324/119 X |
| 3,614,610 | 10/1971 | Legatti | 324/122 X |
| 3,956,697 | 5/1976 | Néry | 324/133 |
| 4,160,206 | 7/1979 | Bojarski | 324/133 |
| 4,163,937 | 8/1979 | Laass | 324/133 X |
| 4,210,862 | 7/1980 | Koslar | 324/149 X |

FOREIGN PATENT DOCUMENTS

| | | | |
|---|---|---|---|
| 1296258 | 5/1969 | Fed. Rep. of Germany | 324/133 |
| 2600253 | 7/1977 | Fed. Rep. of Germany | 324/133 |

*Primary Examiner*—Gerard R. Strecker
*Attorney, Agent, or Firm*—Irvin A. Lavine

[57] ABSTRACT

Mulit-mode voltage and continuity testing apparatus is disclosed for effecting a single pole phase mode of testing, and comprises first and second testing terminals, a loudspeaker, a battery energized oscillator having a control input, a control transistor, and first and second resistances. Circuitry is provided for directly connecting the battery through the emitter and collector of the control transistor to the control input of the oscillator circuit, and the first testing terminal to the base of said control transistor, whereby the testing apparatus effects a single pole phase mode in which a voltage source to be tested is connected to said first testing terminal.

10 Claims, 2 Drawing Figures

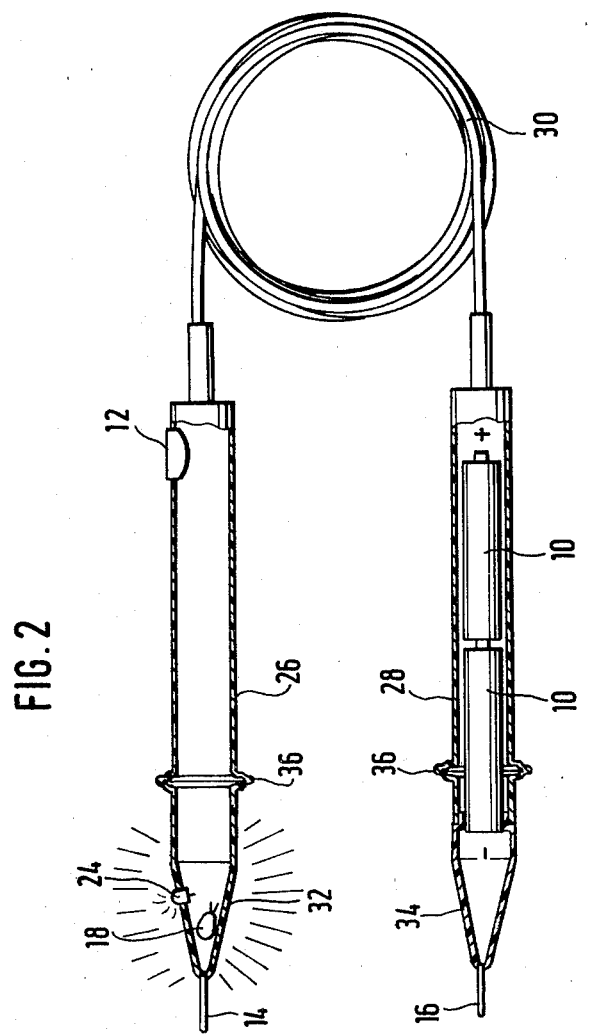

ELECTRONIC VOLTAGE AND CONTINUITY TESTING UNIT

The invention concerns an electronic voltage and continuity testing unit with two pen-shaped casings connected by a cable and each having a testing point, with a voltage-controlled oscillator circuit, fed by a battery arranged in one of the pen-shaped casings and driving a loudspeaker, which is excitable by the battery voltage with an ohmic connection of the testing points and with a glow lamp bridging the testing points and indicating an external voltage applied to them.

Electronic voltage and continuity testing units are known in multiple designs.

For example, a continuity testing unit is known which has a battery-fed oscillator circuit which drives a loudspeaker. When the testing points of these units are short-circuited or connected through a low ohmic resistance, the battery voltage is applied to the control input of the oscillator circuit so that it starts oscillating and the loudspeaker indicates a continuity by means of a buzzing sound. If the oscillator frequency is dependent on the voltage applied to the control inlet, an indication of the ohmic resistance between the testing points is possible by means of the sound level of the buzz.

Furthermore, an electronic voltage testing unit is known where the voltage applied to the testing points is indicated by two anti-parallel-connected glow diodes. With an applied direct voltage, the one or the other glow diode starts glowing, depending on the polarity, while, with an applied alternating voltage, both glow diodes start glowing. In this way, a differentiation between direct and alternating voltage and a determination of the polarity of a direct voltage are possible.

With a further development of this voltage testing unit, a continuity testing is also possible by applying a battery voltage to the glow diodes through the testing points.

Finally, an electronic voltage and continuity testing unit is known where a continuity testing by means of an acoustic buzzer indication is combined with a voltage testing by means of a glow lamp bridging the testing points. The glow lamp starts glowing as soon as an external voltage is applied to the testing points which exceeds the ignition voltage of the glow lamp.

The invention is based on the task of improving an electronic voltage and continuity testing unit of the kind mentioned in the introduction in such a way that not only a voltage and continuity testing is possible but also a phase testing.

This task is accomplished with a voltage and continuity testing unit of the kind mentioned in the introduction in accordance with the invention by the fact that the battery voltage is applied to the control input of the oscillator circuit through the emitter-collector circuit of a control transistor, that the base of this control transistor is connected with a testing point through a first resistance and is applied to the battery voltage through a second resistance and that these two resistances are dimensioned in such a way that, with a voltage applied to the voltage divider formed by these resistances which corresponds to the minimum alternating voltage amplitude, there is a sufficient voltage for the control of the transistor through the second resistance.

The unit according to the invention operates initially in the known manner as a continuity testing unit. When the testing points are short-circuited or connected through an ohmic resistance not exceeding a certain value, the control transistor is activated through the battery voltage above the voltage divider, the battery voltage reaches the control input to the oscillator circuit, the latter starts oscillating and the loudspeaker produces a buzzing sound.

Additionally, the unit according to the invention operates as a voltage testing device. When an external direct voltage is applied between the testing points, said voltage having an opposite polarity with the battery voltage, the control transistor is also activated and the oscillator circuit produces a buzzing sound. When an external voltage is applied between the testing points, said voltage having the same polarity as the battery voltage and exceeds its level, the control transistor is blocked, the battery voltage is not applied to the input of the oscillator, the latter does not oscillate and the loudspeaker does not produce a buzzing sound. Therefore, a direct voltage and its polarity can be determined by exchanging the testing points.

When an external alternating voltage is applied to the testing points, the control transistor is activated each time with the half wave of a polarity and the oscillator circuit is made to oscillate. Thus, an alternating voltage is indicated by a beeping sound which is modulated with the frequency of the applied alternating voltage.

Finally, the unit according to the invention can also be used as a phase testing device. When an alternating voltage or a direct voltage having an alternating voltage component, i.e. a so-called hum, is applied to the testing point connected with the base of the control transistor, this alternating voltage or alternating voltage component can activate the control transistor so that the battery voltage reaches the control input to the oscillator circuit and a beeping sound is produced. A connection between the two testing points is not necessary in this instance. In this way, it can, for example, be determined with the unit according to the invention which line of an alternating current circuit leads the voltage phase.

Advantageous designs and further developments of the invention are indicated herein.

In a further development of the invention, a Graetz bridge circuit is provided in parallel to the glow lamp in the diagonal branch of which a break-down diode and a glow diode are connected in series.

In this design of the invention, the voltage testing is improved insofar as a difference can be made between two voltage ranges. As soon as the applied external voltage exceeds a certain threshold value essentially determined by the break-down voltage of the break-down diode, the glow diode starts glowing. When the voltage exceeds also the higher ignition voltage of the glow lamp, this one starts glowing in addition. Thus, a difference can be made between two voltage ranges, i.e. a voltage range between the break-down voltage of the break-down diode and the ignition voltage of the glow lamp and a range above the ignition voltage.

It goes without saying that the capability of the unit to determine external voltages can still be expanded in that several glow diodes are provided with break-down diodes of a different break-down voltage connected in front of them and/or several glow lamps of a different ignition voltage, always in parallel to each other.

In an advantageous design of the invention, the glow lamp is arranged in the transparent front end of the pen-shaped casing which carries the testing point. Preferably, the glow diode is also placed into this front end.

Therefore, the glowing of the entire front end of the pen-shaped casing indicates an external voltage above the ignition voltage of the glow lamp while the point-like glowing of the glow diode at this front end indicates an external voltage of the lower voltage range.

For reasons of expediency, all electronic components of the unit are arranged in one of the pen-shaped casings and the battery in the other pen-shaped casing.

In this way, it is possible to tightly incorporate the electronic components in the casing so that they are completely protected and the unit is sufficiently robust even when handled in a rough manner in daily use. The second casing can be opened in an easy manner to replace the batteries.

The separation between the circuit portion and the battery portion permits additionally designing the two pen-shaped casings with the same dimensions which, on the one hand, leads to an attractive appearance of the unit and, on the other hand, it makes its manipulation easier.

The invention is further explained below by means of an exemplified embodiment represented in the drawing. There are:

FIG. 1 the circuit of a unit in accordance with the invention and

FIG. 2 a partially axially cut representation of the unit.

The circuit given in FIG. 1 is provided with indications as to the dimensions for the individual switching elements as well as with indications of the types of transistors which are used. These indications of the dimensions and types correspond with an advantageous and, in practical testing, proven design. It goes without saying, however, that variations are possible if the mode of operation described in the following is not impaired, in principle, by them.

The circuit fed by two 1.5 volt batteries 10 with an operating voltage of +3 volts has, first of all, a voltage controlled low-frequency oscillator whose output signal drives a loudspeaker 12. The low-frequency oscillator consists of a pnp transistor $T_1$ connected with its emitter-collector circuit in series with the loudspeaker 12, of a complementary npn transistor $T_2$, whose collector is applied to the operating voltage through a resistance $R_4$ for the control of the base of the transistor $T_1$, of a base resistance $R_5$ of the transistor $T_2$, of a condenser $C_1$ coupling the base of the transistor $T_2$ with the collector of the transistor $T_1$ and of a condenser $C_2$ connecting the collectors of the tansistors $T_1$ and $T_2$.

The operating voltage is applied to the base of the transistor $T_2$ through the emitter-collector circuit of a pnp transistor $T_3$ and a charging resistance $R_2$. The base of the transistor $T_3$ is applied to the positive operating voltage of 3 volts through a resistance $R_1$. Furthermore, the base of the transistor $T_3$ is connected with a testing point 14 of the unit through a resistance $R_3$ which has the same value as the resistance $R_1$. The other testing point 16 is applied to the zero potential.

A glow lamp 18 with a compensating resistance $R_6$ is connected between the testing points 14 and 16. A Graetz bridging circuit 20 is connected in parallel to the glow lamp 18 and its conpensating resistance $R_6$, with a break-down diode 22 and a glow diode 24 being connected in series in the other diagonal of the former. A PTC resistance connected in series with the Graetz bridging circuit 20 serves as an overload protection. The circuit of FIG. 1 operates in the following manner:

When, with a continuity testing, the testing connections 14 and 16 are short-circuited or connected with each other through not too great an ohmic resistance, the voltage drops at the base of the transistor $T_3$ and this transistor is rendered conductive.

The condenser $C_1$ is, consequently, charged through the resistance $R_2$ and the voltage at the base of the transistor $T_2$ rises. The transistor $T_2$ opens after a charging period essentially determined by the condenser $C_1$ and the resistance $R_2$ (as well as the resistance of the transistor $T_3$). The potential at the base of the transistor $T_1$ decreases and this transistor is also rendered conductive. The pole of the condenser $C_1$ which is connected with the collector of the transistor $T_1$ and which was applied to 0 volt through the loudspeaker 12, is thus brought to a positive potential so that the condenser $C_1$ is charged and discharged.

The charging and discharging of the condenser $C_1$ disposes a negative signal at the base of the transistor $T_2$ so that it is blocked and, in its turn, blocks again the transistor $T_1$. Now, a renewed charging of the condenser $C_1$ can be effected through the transistor $T_3$ and the resistance $R_2$ and the described process is repeated as long as the transistor $T_3$ is connected through.

The oscillating process of the oscillator caused by the charging and discharging of the condenser $C_1$ becomes audible through the loudspeaker 12 as a humming or whistling sound. The oscillating frequency of the oscillator is stabilized by the reaction condenser $C_2$ connected between the collector and base of the transistor $T_1$.

In the same way as by an ohmic connection of the testing connections 14 and 16, a turn-on of the transistor $T_3$ can also be caused by the fact that an external direct voltage is applied to the testing connections 14 and 16 if the minus pole of this direct voltage is applied to the testing point 14.

When an external alternating voltage is applied to the testing points 14 and 16, the transistor $T_3$ is only connected through as long as the negative half wave is applied to the testing point 14. Therefore, the oscillating of the oscillator is only effected always during a half-period of the applied external alternating voltage so that the loudspeaker produces a beeping sound at which the humming or whistling sound determined by the oscillator frequency is modulated with the frequency of the external alternating voltage.

When an alternating voltage is only applied to the testing point 14, it can also turn-on the transistor $T_3$. Since the direct voltage potential of the testing point 14 is not influenced by this fact, this is possible in the same way when, instead of an alternating voltage at the testing point 14, a direct voltage is applied with an alternating voltage portion, i.e. with a so-called hum.

It is assumed that this effect is based on the fact that the testing points 14 and 16 are capacitively connected with each other, i.e. through the alternating voltage, owing to the minimum capacity vis-a-vis the environment. Therefore, the alternating voltage portion of the external voltage being applied by itself to the testing point 14 can drop through the voltage portion formed by the resistance $R_1$ and $R_3$ and turn-on the transistor $T_3$.

The prerequisite for this is that the resistance $R_1$ is not small with respect to the resistance $R_3$ so that there is an essential portion of the alternating voltage available as control voltage for the transistor $T_3$ through this resistance $R_1$. In the case of the special dimensioning indicated in FIG. 1 where the resistances $R_1$ and $R_3$ have the same value, an oscillating of the oscillator and a beeping sound of the loudspeaker 12 are already obtained when an alternating voltage portion of about 1 mV is only applied to the testing point 14.

The relationship of the resistances $R_1$ and $R_3$ is essential for the use of the unit as a phase testing device with only the testing point 14. The absolute value of the resistance $R_1$ essentially determines the measuring range for the continuity testing. An ohmic resistance connecting the testing points 14 and 16 during the continuity testing actually forms a voltage divider together with the resistance $R_5$ and the resistance $R_1$ whose relation determines the control voltage applied between the base and emitter of the transistor $T_3$. The greater the resistance $R_1$ is, the greater can be an ohmic resistance between the testing points 14 and 16 at which the transistor $T_3$ is still connected through and the loudspeaker emits a signal.

In principle, the value of the resistance $R_1$ can also be of an infinite size, i.e. no resistance $R_1$ is connected between emitter and collector of the transistor $T_3$. This would only increase the sensitivity of the unit to too high a level so that it would respond to the slightest interference.

The resistance $R_3$ essentially determines the input resistance of the unit for applied external voltages. For this reason, the resistance $R_3$ should be selected on as high a level as possible. However, a high value of the resistance $R_3$ is in contradiction to a favorable voltage divider relation between the resistances $R_1$ and $R_3$. For this reason, an equal value of the resistances $R_1$ and $R_3$ has proven to be favorable.

The value of the resistances $R_1$ and $R_3$ determines, of course, also the testing current which flows between the testing points 14 and 16 during the continuity testing. The high value of these resistances $R_1$ and $R_3$ limits this testing current to a few $\mu A$ so that also semiconductor components can be tested without the risk of damage.

In the case of the dimensioning given in FIG. 1 as an exemplified embodiment, the testing current is limited to approximately 2.2 $\mu A$ during the continuity testing. A testing current of approximately 15 mA flows with an applied external voltage of 220 V. An external voltage applied to the testing points 14 and 16 causes the glow diode 24 to glow when the break-down voltage of the break-down diode 22 of, for example, 7 V, is exceeded. Owing to the Graetz bridging circuit 20, it is, in this instance, of no importance whether the external voltage is an alternating voltage or a direct voltage and, by the same token, the polarity of the direct voltage has no influence whatsoever.

If the external voltage applied to the testing points 14 and 16 exceeds the ignition voltage of the glow lamp 18 of, for example, 60 V, also the glow lamp 18 starts glowing. The PTC resistance limits the current flowing through the break-down diode 22 and the glow diode 24 with higher external voltages.

The unit permits the following tests:

1. Continuity test: Acoustic indication with continuity.
2. Voltage indication: Optical indication of the voltage range independent of the kind and polarity of the voltage. Acoustic indication: with alternating voltage a modulated beeping sound, with direct voltage a continuous whistling sound.
3. Polarity test with direct voltage: Testing point 14 at negative pole—continuous whistling sound, testing point 16 at positive pole—no sound.
4. Phase test: Use only of the testing point 14, with the presence of an alternating voltage or of a direct voltage with alternating voltage portion with the frequency of the alternating voltage—modulated beeping sound.

An advantageous design of the unit is represented in FIG. 2. The unit consists of two pen-shaped casings 26 and 28 which are connected with each other by a flexible cable 30. The front ends 32 or 34 of the casings 26 and 28 are flared out and carry the testing points 14 or 16. Additionally, the casings are provided with slip fuses 36 in the known manner.

The pen-shaped casing 26 is entirely closed and contains all components shown in FIG. 1. The point 32 of the casing 26 consists of a transparent material, for example, a transparent plastic. The glow lamp 18 is arranged in this point 32 so that the entire point 32 starts glowing when the glow lamp 18 is on. The glow diode 24 is also inserted into the point 32. The entire light indication for the different voltage ranges is comprised in this way in the conical front end 32.

The second pen-shaped casing 28 receives the two 1.5 V batteries 10. The conical front end 34 is placed on the casing 28 in such a way that it can be pulled off to insert and change the batteries. The casings 26 and 28 consisting of insulating plastic as well as their flared out front ends 32 and 34 are exactly the same in shape and dimensions.

I claim:

1. Testing apparatus having the capability of effecting a single voltage pole mode of testing and of effecting a continuity mode of testing, said apparatus comprising:
    (a) first and second testing terminals;
    (b) a loudspeaker;
    (c) a battery energized oscillator circuit coupled to energize said loudspeaker and having a control input, said second testing terminal being coupled to said oscillator circuit;
    (d) a control transistor having a base, an emitter and a collector;
    (e) first and second resistances, said first resistance being connected in circuit between said base and said emitter of said control transistor, the battery being connected through said emitter and collector of said control transistor to said control input of said oscillator circuit, said first testing terminal being connected through said second resistor to apply an AC voltage component to said base of said control transistor;
    (f) said first and second resistances being valued such that when a test alternating voltage component is applied solely to said first testing terminal, a sufficient voltage appears upon said first resistance for the control of said control transistor;
    (g) said oscillator circuit operative in a continuity mode upon the ohmic connection of said first and second testing terminals, whereby a voltage is applied to said base rendering said control transistor conductive and applying an enable signal to said control input to render said oscillator circuit into an oscillating state thereby producing an oscillator output signal energizing said loudspeaker, and operative in a single pole voltage mode, whereby an alternating voltage component as applied solely to said first testing terminal is imposed across said first and second resistances to render conductive said control transistor and to apply an enable signal through said conductive control transistor to said control input to render said oscillator circuit to its oscillating state, thereby producing an oscillator output signal modulated by the frequency of said alternating voltage component energizing said loudspeaker.

2. Apparatus according to claim 1, wherein said first resistance is larger than said second resistance.

3. Apparatus according to claim 1, wherein said first and second resistances have substantially the same resistance values.

4. Apparatus to claim 1, wherein said first and second testing terminals are bridged by a glow lamp which indicates external voltages applied to said first and second testing terminals.

5. Apparatus according to claim 4, wherein a Graetz bridging circuit is connected in parallel to said glow lamp in a diagonal branch of which a break-down diode and a glow diode are connected in series.

6. Apparatus according to claim 1, wherein said first and second testing terminals are placed respectively into first and second pen-shaped casings, and are interconnected by a cable.

7. Apparatus according to claim 5, wherein said glow lamp is arranged in a transparent forward end portion of said first casing.

8. Apparatus according to claim 7, wherein said glow diode is placed into said forward end portion of said first casing.

9. Apparatus according to claim 6, wherein said electronic components of said apparatus are arranged in one of first and second casings, and the battery is disposed in the other of said first and second casings.

10. Apparatus according to claim 9, wherein said first and second casings have substantially the same configuration and dimensions.

* * * * *